(12) United States Patent
Van Den Berg et al.

(10) Patent No.: US 10,879,039 B2
(45) Date of Patent: Dec. 29, 2020

(54) ADDITIVE LAYER MANUFACTURE USING CHARGED PARTICLE BEAMS

(71) Applicant: Reliance Precision Limited, Huddersfield (GB)

(72) Inventors: Jakob Albert Van Den Berg, Manchester (GB); Martyn James Hussey, Manchester (GB); William Thomas Richardson, Stainland (GB); Ian Laidler, Huddersfield (GB)

(73) Assignee: RELIANCE PRECISION LIMITED, West Yorkshire (GB)

( * ) Notice: Subject to any disclaimer, the term of this patent is extended or adjusted under 35 U.S.C. 154(b) by 21 days.

(21) Appl. No.: 16/470,035

(22) PCT Filed: Dec. 15, 2017

(86) PCT No.: PCT/GB2017/053760
§ 371 (c)(1),
(2) Date: Jun. 14, 2019

(87) PCT Pub. No.: WO2018/109489
PCT Pub. Date: Jun. 21, 2018

(65) Prior Publication Data
US 2019/0362936 A1    Nov. 28, 2019

(30) Foreign Application Priority Data

Dec. 16, 2016  (GB) .................................. 1621508.9

(51) Int. Cl.
*H01J 37/305* (2006.01)
*H01J 37/304* (2006.01)
*H01J 37/30* (2006.01)

(52) U.S. Cl.
CPC ........ *H01J 37/305* (2013.01); *H01J 37/3045* (2013.01); *H01J 37/3007* (2013.01);
(Continued)

(58) Field of Classification Search
CPC .. H01J 37/305; H01J 37/3045; H01J 37/3007; H01J 2237/0044; H01J 2237/3128
(Continued)

(56) References Cited

U.S. PATENT DOCUMENTS

| 5,739,528 A * | 4/1998 | Kato ..................... H01J 27/028 250/251 |
| 2016/0211116 A1 | 7/2016 | Lock |
| 2017/0341142 A1* | 11/2017 | Ackelid ................. B33Y 40/00 |

FOREIGN PATENT DOCUMENTS

| WO | 2008147306 A1 | 12/2008 |
| WO | 2013098050 A1 | 7/2013 |

OTHER PUBLICATIONS

PCT, International Search Report and Written Opinion of International Application No. PCT/GB2017/053760; dated Mar. 29, 2018.

* cited by examiner

*Primary Examiner* — Nicole M Ippolito
(74) *Attorney, Agent, or Firm* — Perry + Currier Inc.

(57) ABSTRACT

A method of charge mitigation in additive layer manufacturing is provided, which uses a charged particle beam (103) to fuse metal powder (122) within a metal powder bed (123) to form a product layer-by-layer, the method comprising using a charged particle beam optical system to form a charged particle beam, to steer the charged particle beam to be incident on a powder bed of metal powder and to scan over the powder bed to fuse powder into a desired layer shape. While steering the charged particle beam, the method comprises using a neutralising particle source (160) to generate neutralising particles of an opposite charge to the charged particles in the vicinity of the charged particle beam such that the neutralising particles are attracted to the charged particles of powder in the powder bed. An additive layer manufacturing apparatus (100) is also provided.

25 Claims, 6 Drawing Sheets

(52) U.S. Cl.
 CPC ............... *H01J 2237/0044* (2013.01); *H01J 2237/3128* (2013.01)

(58) Field of Classification Search
 USPC ......... 250/396 R, 397, 492.1, 492.2, 492.21, 250/492.22, 492.23, 492.3
 See application file for complete search history.

ADDITIVE LAYER MANUFACTURE USING CHARGED PARTICLE BEAMS

FIELD OF THE INVENTION

The present invention relates to charge control on metal powders in electron beam or charged particle additive layer manufacture.

BACKGROUND TO THE INVENTION

Additive layer manufacturing is a manufacturing process in which material is selectively deposited onto a substrate in layers in order to form a three-dimensional article. One of the most prominent technologies employed for this process is powder bed fusion, in which a thin layer of powder—typically metal or plastic—is selectively melted by an energy source such as a laser or electron beam. The melted area of the powder layer forms a cross-sectional part of the article, whereas unmelted powder in the layer is discarded and usually recycled at the end of the process. After the layer has been selectively melted, a new layer of powder is deposited and then also selectively melted so that the complete article is constructed layer-by-layer.

The present invention is primarily concerned with additive layer manufacture using a metal powder heated by an electron beam, although other charged species such as positively charged ions may be used to heat the metal powder bed. An electron optical assembly provides the electron beam. The electron optical assembly comprises an electron source and electric and/or magnetic fields to form, condition and steer the electron beam. Commonly, the electron beam is steered using electromagnetic deflectors that are controlled to scan the electron beam across the powder bed such that a pattern may be scanned or traced over the powder bed. Similar arrangements may be used to generate, condition and steer a charged particle beam.

As the electron beam is scanned over the powder bed, energy is deposited into the powder, raising its temperature. Exposure to the electron beam is carefully controlled to ensure complete melting of metal powder so that the powder particles within the top layer fuse together and so that the powder particles within the top layer also fuse with the previous layer thereby forming a solid product.

The metal powder is typically a metallic alloy, and a range of materials have been used in additive layer manufacture. Both aluminium and titanium alloys are used due to their desirable material properties, although both suffer from a disadvantage in that both these materials tend to oxidise and become insulating or semi-insulating powders. When in this insulating or semi-insulating state, irradiation with the negatively charged electron beam causes the metal powder particles to become themselves charged and to retain that charge or a fraction thereof. A similar effect arises when irradiated with positively charged particles, although the metal powder particles gain a net positive charge rather than a negative charge.

As the charge accumulation increases, the metal powder particles repel each other due to space charge effects and they can form a cloud or region of charged metal particles above or alongside the powder bed. Furthermore, under the vacuum conditions required for electron beam processing, the charged metal particles move freely due to coulomb repulsion. Pressures of typically $10^{-3}$ to $10^{-6}$ mbar may be maintained within a vacuum chamber. Hence, the mobile charged metal particles migrate around the vacuum chamber, including into the electron optical assembly where they can adversely affect the electron optical assembly. Furthermore the charged particles can migrate to the top of the electron optical assembly to the electron or charged particle source which will typically be held at a high voltage such as −60 kV. The introduction of metallic particles into this area of the electron optical assembly will cause high voltage arcing with possible damage to the electron or charged particle emitter or the high voltage power supply itself. Significant down time is required to clean the column of these metal particles. Continuation of the manufacturing process could result in poor quality parts, if indeed the machine still functions.

SUMMARY OF THE INVENTION

From a first aspect, the present invention resides in a method of charge mitigation in additive layer manufacturing using a charged particle beam to fuse metal powder within a metal powder bed to form a product layer-by-layer. The method comprises using a charged particle beam optical system to form a charged particle beam, to steer the charged particle beam to be incident on a powder bed of metal powder and to scan over the powder bed to fuse powder into a desired layer shape.

While steering the charged particle beam, the method further comprises using a neutralising particle source to generate neutralising particles of an opposite charge to the charged particles in the vicinity of the charged particle beam and/or the powder bed. For example, the charged particle beam may be a positively charged ion beam, and the neutralising particles may be electrons. However, in the following paragraphs of this summary of the invention, the charged particle beam is assumed to be an electron beam and the neutralising particles are assumed to be positive ions. The person skilled in the art will understand that the description below may be adapted for the alternative arrangement where the charged particle beam is a positively charged ion beam and the neutralising particles are electrons, and the invention will function in essentially the same way and offer the same advantages.

The positive ions will be attracted to the negative space charge of the electron beam and the negatively charged powder. The electron beam may be considered as producing a space charge that attracts and traps the mobile positive ions produced by an ion source acting as the neutralising particle source. These "trapped" positive ions will then move along the electron beam towards a relatively negative potential. As noted above, the electron beam striking the powder bed produces a region of negatively charged powder particles in, and potentially in the vicinity of, the powder bed. Hence, the positive ions will be attracted to the negatively charged powder particles, through the conduit of the electron beam and/or by moving to the target directly, where they help neutralise some or all of this negative charge. This then helps mitigate the adverse effects of the negative charge due to the electron beam, and keeps the powder particles below an electric field threshold at which Coulomb interaction makes them mobile. The rate at which the ion source produces positive ions may be adjusted so as to help balance the rate of production of negatively-charged powder particles.

Optionally, the ion source is used to produce positive ions of an inert gas, for example an inert gas, such as Helium or Argon. This has the advantage of not causing interstitial contamination of the metal lattice of the resulting metal product as the neutralised inert gas can be pumped away by the vacuum system.

Charge control may be obtained using a gas discharge ion source such as uses a plasma source, also referred to herein as a plasma flood source, or electric discharge to create the ions. Low energy ions are produced in a discharge chamber. A gas, typically Argon or Helium, is used to sustain a discharge leading to a plasma which is contained in a confined space which can supply low energy ions. The positive ions emanating from the plasma drift from the source, which may be biased with a small positive potential to add to the energy of the positive ions and are attracted to the negative space charge of the electron beam in which they become trapped and/or directly to the charged powder particles. The positive ions tend to move towards a negative potential. Ions created in the ion source are in this way drawn towards the negative potential generated by the electron beam interacting with the oxide layer on the powder. This process thereby provides low energy ions on demand to the powder being processed. The ion energy may be controlled by the bias potential of the plasma source and chosen to maximize the flux of ions to the charged powder bed whilst not interfering with the fusing process of the powder.

The ion source may be a gas discharge ion source that is operated to generate the positive ions. Confinement magnets may be used to confine the plasma generated from a source gas, such as argon or helium. A small positive or even negative potential may be applied to control the ion energy after they have escaped from the plasma boundary with an energy set by the plasma potential, and move into the body of the vacuum chamber. The positive ions may then move towards the negative space charge potential of the electron beam and intercept the electron beam. In this configuration, positive ions also exit the source and travel directly to the powder bed whose negative charge will attract the positive ions. The ion source may be a DC plasma source, that utilises DC magnetic fields and that has a DC current flowing through a filament of the plasma source. Use of DC sources for magnetic confinement and plasma generation minimises the effect that time varying magnetic and electric fields would have on the electron beam, that may deflect the electron beam and cause write errors when the electron beam is being scanned.

In addition to the negative potential caused by the powder particles in and above the powder bed, a further negative potential may arise due to the electron optical system, especially the accelerating voltage applied to the electron source. This is because the electron optical system is held at a significant negative potential to accelerate the electrons in the electron beam away from an electron source and towards the powder bed. Without intervention, the positive ions trapped within the electron beam could also migrate towards the electron source and cause impact damage to an electron emitter of the electron source causing degradation in performance. To prevent this, the method may comprise using an electrode to set a positive potential upstream of the ion source thereby preventing positive ions from migrating past the electrode into the electron optical system.

The method may comprise steering the electron beam using a control signal. This control signal may cause the electron beam to be scanned through a series of predetermined positions, for example to trace and fill a desired layer shape on the powder bed. The control signal may have been subject to a correction to compensate for the disturbance of the electron beam caused by the ion source. For example, a magnetic field associated with the ion source to effect plasma confinement may deflect the electron beam. Also, currents passing through wires in the ion source, for example the filament current of a DC plasma source may create a magnetic field that deflects the electron beam.

The deflection of the electron beam from its intended path may stem from the magnetic and electrical fields generated by plasma containing magnets and the high energising current of the ion source. When these effects occur, they will generally include both a positional change in the electron beam and a change in the beam quality (for example the shape and/or focus of the electron beam). In many arrangements, these effects will have a dependency on the relative position of the electron beam and the generated magnetic and electrical fields. That is, they will have a dependency on the deflected position of the electron beam over the powder bed.

These effects will also have a dependency on the operating conditions of the ion source and may be mitigated by a scheme of calibration and correction. For instance, the correction applied to the control signal may be obtained from a look-up table that provides the required corrections for a given desired electron beam position on the powder bed. The calibrations may be effected by measuring the differences between observed and expected values for the electron beam position on the powder bed over a range of electron beam deflections and ion source operating conditions. During calibration, the electron beam may be scanned through a series of expected electron beam positions on the powder bed while the ion source is operating. During the scan, the corresponding actual positions of the electron beam on the powder bed for each of the expected electron beam positions is measured. The difference between each pair of expected and actual electron beam positions may be used to calculate a correction that effectively cancels the deflection and distortion caused by the ion source The corrections so found may be stored in a look-up table. These corrections may be applied when a product is being formed. For example, corrections may be applied to deflection, focus and stigmator values in the electron beam optical system, and may be based on operating conditions such as transverse beam deflection and plasma source filament current and the target deflection values. As mentioned above, a convenient way to achieve this is by means of look-up tables (LUTs) which may be indexed by deflection value. Other methods are also available.

From a second aspect, the present invention resides in an additive layer manufacturing apparatus comprising an electron optical assembly. The electron optical assembly comprises an electron source, electron beam forming apparatus operable to form a beam from the electrons provided by the electron source, and electron beam steering apparatus operable to steer the electron beam formed by the electron beam forming apparatus. The additive layer manufacturing apparatus further comprises at least one hopper operable to dispense powder and a table positioned to receive the powder dispensed by the at least one hopper in a volume defining a powder bed for receiving the electron beam. The electron beam steering apparatus is operable to scan the electron beam over the powder bed. The additive layer manufacturing apparatus further comprises a vacuum chamber through which the electron beam passes before being incident on the powder bed and an ion source operable to provide positive ions in the chamber in the vicinity of the electron beam and/or powder bed such that the positive ions are attracted to the electron beam and/or negatively charged powder particles.

Other optional features of the additive layer manufacturing apparatus are set out in the appended claims.

BRIEF DESCRIPTION OF THE DRAWINGS

In order that the invention can be more readily understood, reference will now be made by way of example only, to the accompanying drawings in which:

FIG. 2 is a schematic representation of an electron optical assembly operable to provide an electron beam and to scan the electron beam in accordance with embodiments of the present invention, with FIG. 2a corresponding to a side view and FIG. 2b corresponding to a view through line B-B of FIG. 2a;

DETAILED DESCRIPTION OF EMBODIMENTS

Figure 1:
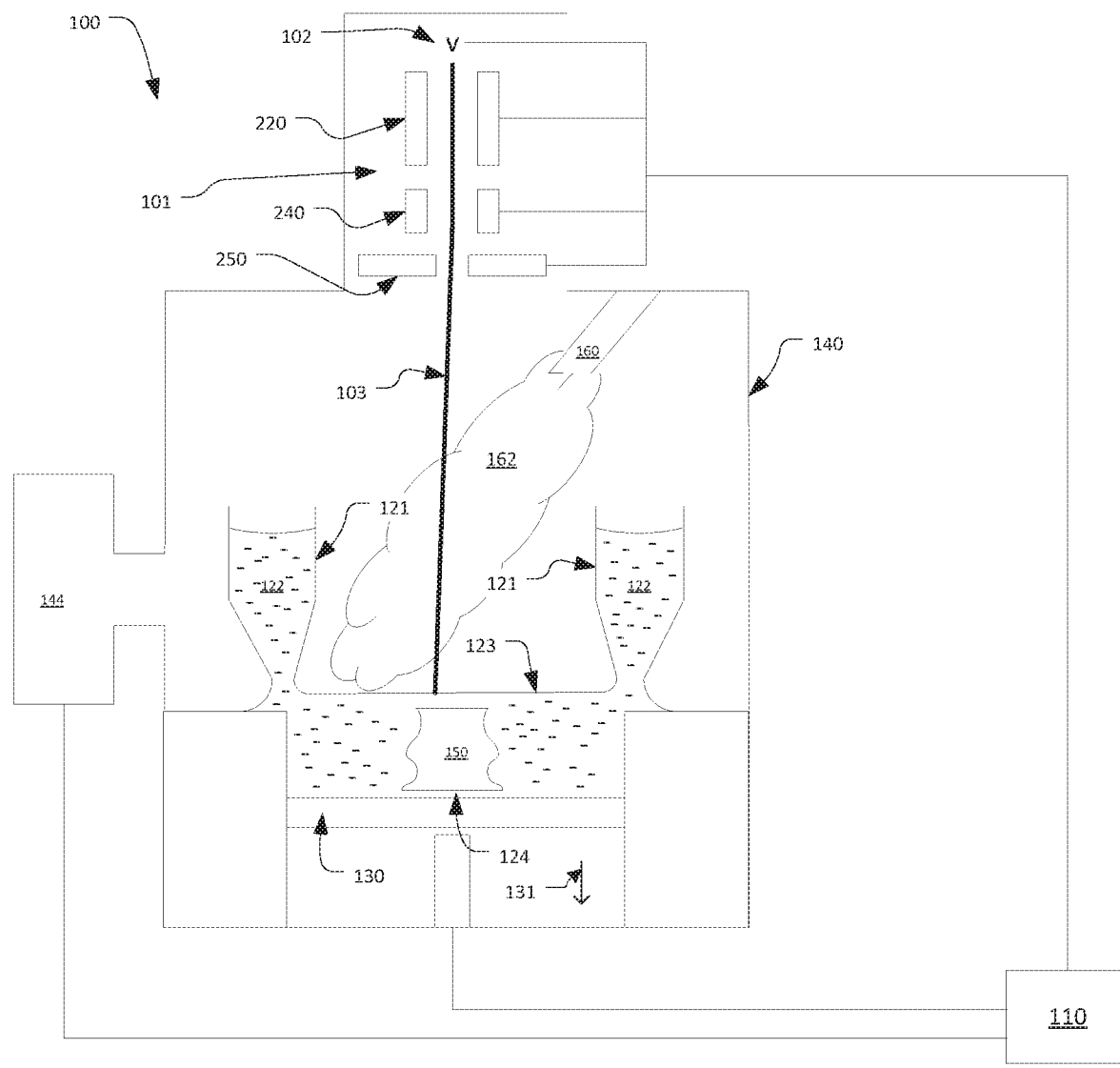
FIG. 1 shows additive layer manufacture apparatus with which the present invention may be used.

FIG. 1 shows additive layer manufacturing apparatus 100 in which embodiments of the present invention may be implemented. The apparatus 100 shown in FIG. 1 is configured for additive layer manufacture of products from metal powder using an electron beam.

To this end, the apparatus 100 comprises an electron optical assembly 101 that forms, conditions and steers an electron beam 103, as will be described in more detail below. The apparatus 100 further comprises powder hoppers 121 containing metal powder 122 and a movable table 130. The hoppers 121 dispense powder so as to lay down a thin layer of the powder on the table 130. Any number of hoppers 121 may be used, and the two shown in FIG. 1 are but merely an example. A mechanism such as a scraper or blade (not shown) may be used to disperse the powder 122 evenly over the table 130. The electron optical assembly 101 steers the electron beam 103 such that the electron beam 103 is scanned over the powder bed 123 to fuse the powder 122 and form a solid product 150. The apparatus 100 also includes a plasma source 160 positioned between the electron optical assembly 101 and the powder bed 123.

After each layer of the product 150 has been formed, the table 130 is lowered in the direction indicated by arrow 131. The table 130 is lowered such that the top surface of the powder bed 123 is always formed at the same height relative to the electron beam 103. The initial layer of the powder bed 123 may be deposited to be thicker than the successive layers to minimise heat conduction to the table 130 which may cause the powder 122 to fuse with the table 130. Thus, a complete layer of unfused powder 124 is left beneath the product 150 as it is formed.

Additive manufacture using electron beams is performed under vacuum conditions, hence the apparatus 100 comprises an enclosing vacuum chamber 140. The vacuum within the vacuum chamber 140 is created and maintained by a pumping system 144, such as any commonly available pumping system, for example a turbomolecular pump backed by a roughing pump. The pumping system 144 may be controlled by a controller 110. As shown in FIG. 1, the pumping system 144 may be used to evacuate the portion of the vacuum chamber 140 housing the electron optical assembly 101. The pressure in the vacuum chamber 140 may be in the range of $1\times10^{-3}$ mbar to $1\times10^{-6}$ mbar.

Figure 2B:
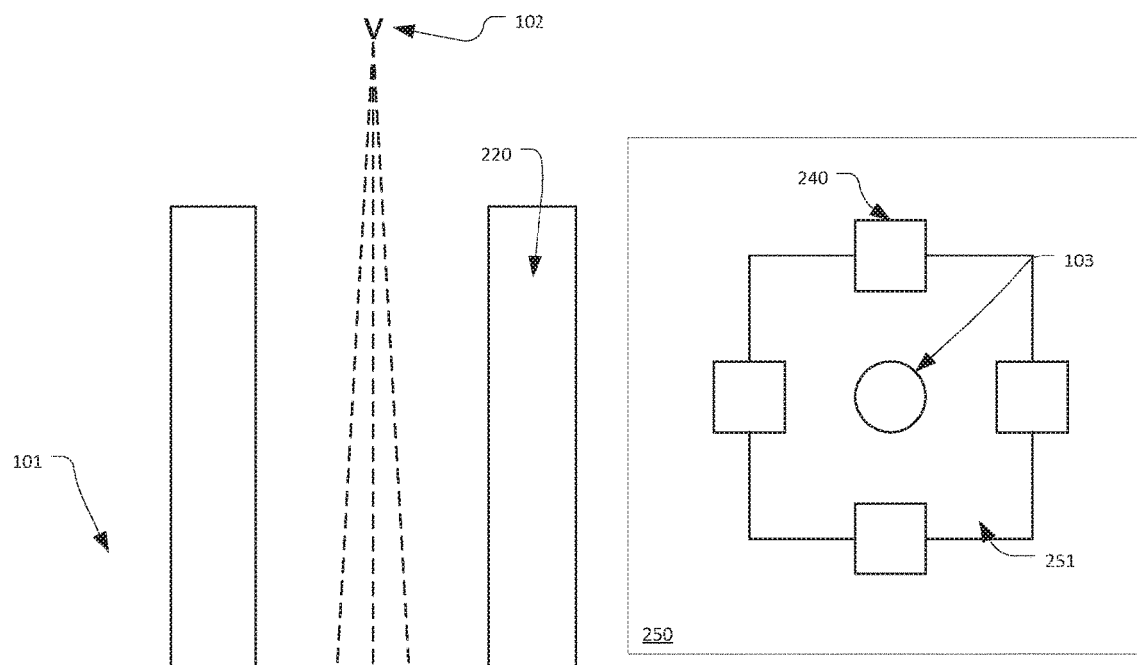
Figure 2A:
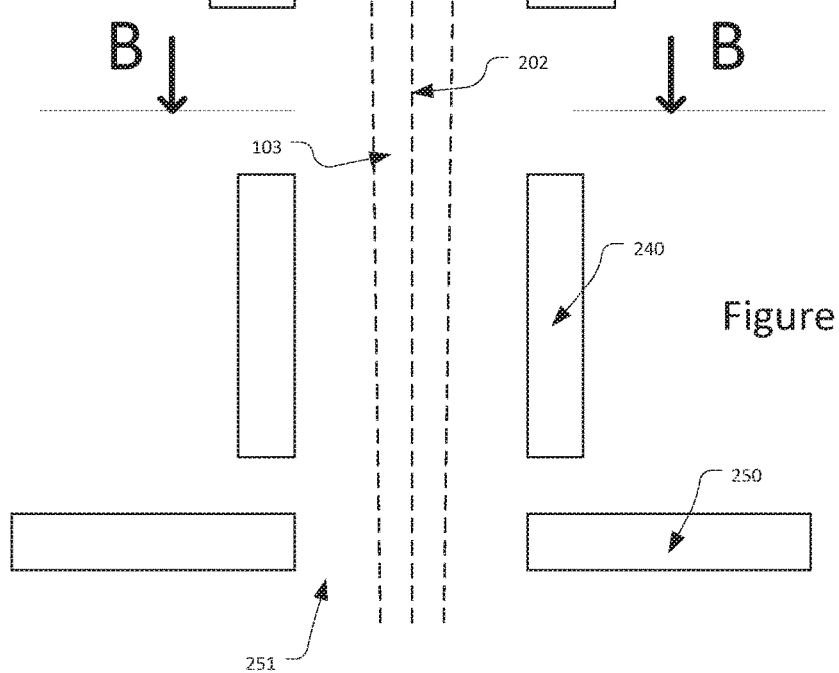

FIGS. 2a and 2b show the electron optical assembly 101 in more detail. The electron optical assembly 101 comprises an electron source 102 for generating and emitting electrons, lenses 220 for forming and conditioning an electron beam 103 from the emitted electrons, and one or more electromagnetic deflectors 240 for steering the electron beam 103. A cylinder electrode 250 provided with a central aperture 251 is positioned immediately beneath the deflectors 240. The purpose of this cylinder electrode 250 will be explained below.

Operation of the electron source 102, lenses 220, deflectors 240 and cylinder electrode 250 is controlled by a controller 110 such as a suitably programmed computer. Any conventional arrangement of electron source 102, lenses 220 and deflectors 240 may be used, and so will not be described in detail here. Essentially, the electron source 102 and lenses 220 deliver a focussed electron beam 103 that is travelling along the central axis 202 of the electron optical assembly 101 which is then deflected by the deflectors 240 so as to scan the electron beam 103 over the powder bed 123. The aperture 251 provided in the cylinder electrode 250 is aligned with the central axis 202 and is sized such that the electron beam 103 passes through the aperture and does not clip the edge of the aperture 251 at the full working deflection of the electron beam 103.

FIG. 1 shows a plasma source 160 positioned within the vacuum chamber 140. In this embodiment, the plasma source 160 is controlled by the controller 110. The plasma source 160 is mounted to the vacuum chamber 140, for example via a feedthrough mounted to a flange. The feedthrough may provide electrical connections to the plasma source 160, for example connections for a power supply and for the controller 110.

Figure 3:
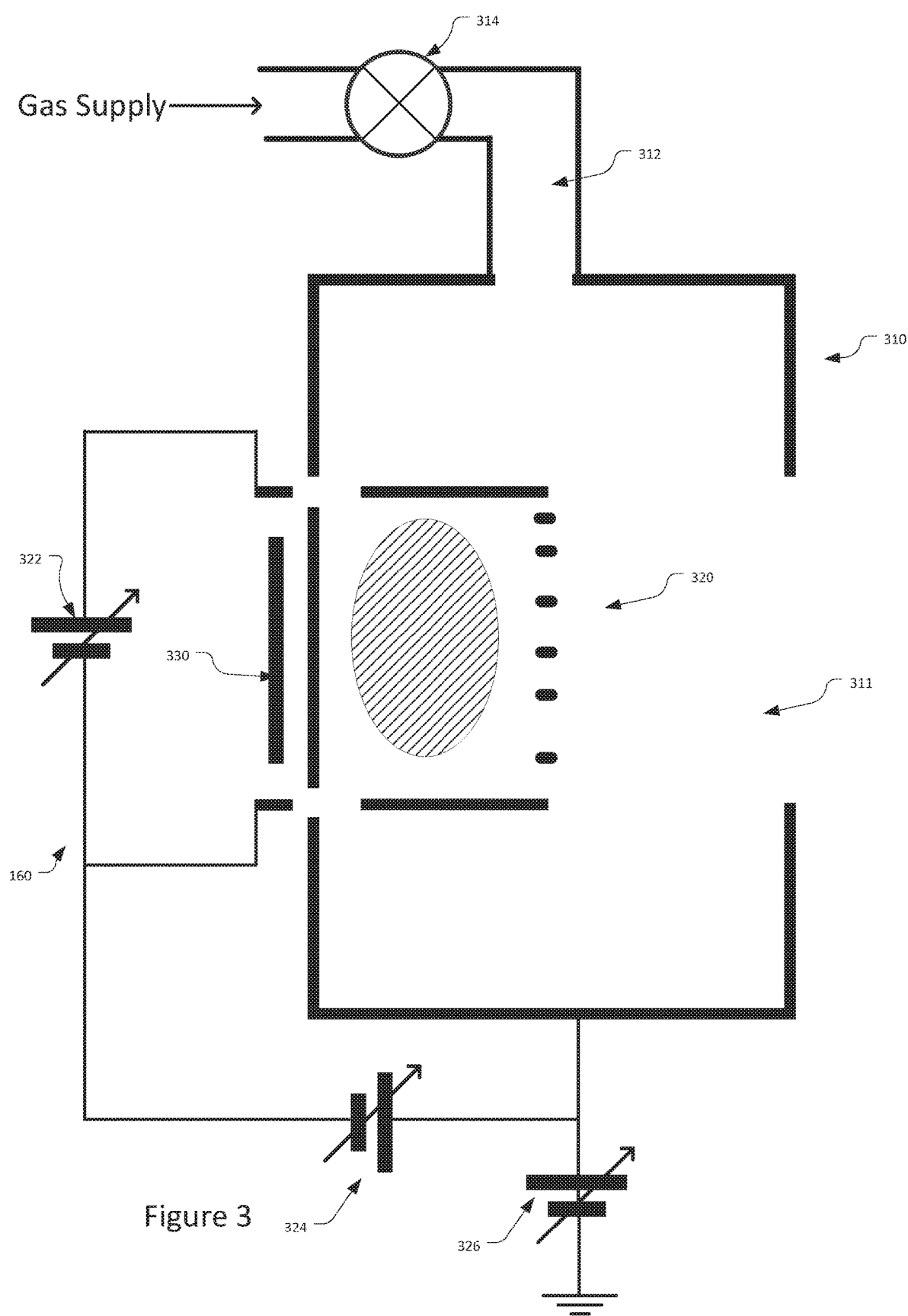
FIG. 3 is a schematic representation of an ion discharge or plasma source.

FIG. 3 shows the plasma source 160 in more detail. The plasma source 160 comprises an arc chamber 310 in which a plasma is generated and confined. A source gas, typically argon or helium, is supplied to the arc chamber 310 via a gas supply line 312. The gas supply may be switched on and off using valve 314. An arc discharge running between a hot filament 320 and walls of the arc chamber 310 is used to ionise the source gas molecules to create the plasma. To create an electrical discharge, filament 320 is held at a moderate negative potential relative to the arc chamber 310. A filament power supply 322 is used to provide a current to the filament 320 and an arc power supply 324 is used to provide a potential difference between the filament 320 and the arc chamber 310 greater than that required for electron impact ionisation of gas molecules, such that an electrical arc discharge is created between the hot filament 320 and the arc chamber 310. Rather than holding the arc chamber 310 at ground potential, a small positive bias is put on the arc chamber 310 by a source bias supply 326 in order to cause the positive ions to drift out into the powder processing chamber.

The arc discharge created between the filament 320 and the arc chamber 310 ionise the gas molecules within the arc chamber 310, thereby creating a plasma that is mostly confined by a set of magnets 330 and the magnetic field created by the filament 320. A steady stream of ions may escape through an aperture 311 provided in the arc chamber 310 and then from the plasma boundary which will extend slightly beyond the aperture 311. The ions will have an energy set by the plasma potential in the absence of a bias potential applied to the arc chamber 310. These ions will then be attracted to relatively negative potentials in the vacuum chamber 140, for example the negative potential of the electron beam 103 and any charged powder particles 122.

The plasma source 160 is positioned between the electron optical assembly 101 and the powder bed 123. The flux of positive ions produced by the plasma source 160 is shown schematically in FIG. 1 and indicated by the reference number 162. The positive ions 162 move away from the plasma source 160 and are attracted to the negatively charged electron beam 103, as well as negatively charged powder particles 122. A distributed area of positive ions is produced near the powder bed 123, and the mobility of the ions helps the system to self-regulate. The ions travel to areas of rising negative potential when the negatively charged powder particle 122 are released from the powder, and in the case where helium is selected as the source gas, its higher ion mobility due to its lower atomic mass may aid its capacity to neutralise the charge build up on the powder 122.

Figure 4:
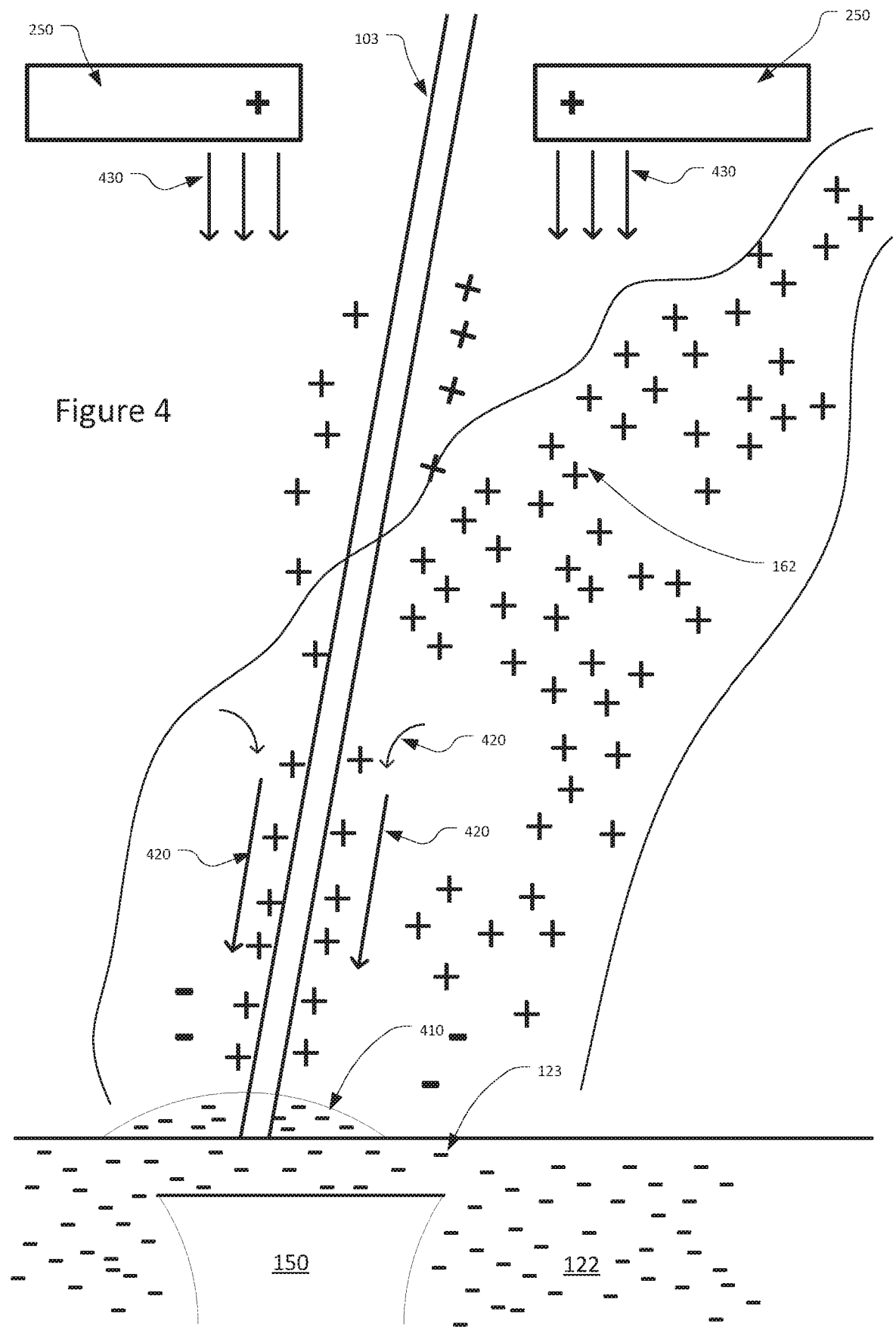
FIG. 4 is a schematic representation of how the positive ions produced by the ion source may interact with the electron beam and the metal powder 122.

FIG. 4 shows the interaction of the positive ions 162 with the electron beam 103 and the powder 122 in more detail. As noted above, the interaction of the negatively charged electron beam 103 with the powder particles 122 can cause the particles 122 to become charged, for example where the powder particles 122 have oxidised and so are insulating or only semi-conducting. The negatively charged powder particles 122 form a negative space charge cloud above the powder bed 123, as shown schematically in FIG. 4 at 410. FIG. 4 also shows schematically the negatively charged electron beam 103, and how the positive ions 162 may in the first instance become entrapped with the negative space charge potential of the electron beam 103. These positive ions 162 are also attracted by the greater negative potential created by the charged powder particles in the powder bed 123 and so move in the direction indicated by the arrows 420. The positive ions 162 arriving at the space charge cloud 410 of negatively charged powder particles 122 and powder particles 122 in the powder bed 123 compensate fully or partially the charge on the powder particles. The charge compensation of the charged powder particles in this way mitigates against the adverse effects of the charged powder particles. In particular, it mitigates against the effect where the charged powder particles repel each other and "spread" around the vacuum chamber 140 and into the electron optical assembly 101, causing localised charging and high voltage breakdowns in the electron optical assembly 101, and disruption to the layer fusing process.

The electron source 103 is held at a negative potential relative to the electron beam 103 to accelerate the electrons in the beam 103. However, this negative potential attracts the positive ions 162 in the same way that the negative potential of the charged powder particle cloud 410 does. Without any corrective action, the positive ions 162 would migrate into the electron optical assembly 101 and could potentially be accelerated into the electron source 102 causing additional heating and damage to the electron emitter. To prevent this, the cylinder electrode 250 is provided. The controller 110 sets the potential of the cylinder electrode 250 to be sufficiently positive to form a barrier to the streaming up of any positive ions 162. Consequently, the cylinder electrode 250 repels the positive ions 162 such that none of the positive ions 162 can migrate into the electron optical assembly 101. This is shown schematically in FIG. 4 by the arrows 430.

The plasma source 160 generates static electromagnetic fields by virtue of the plasma confinement magnets 330 and the electric current in the filament 322. The sum of these fields, will act on the electron beam 103 and cause a deflection of the electron beam 103. However, compensation for this deflection may be obtained through calibrating the additive layer manufacturing apparatus 100, for example as described below.

The calibration is effected using a two-dimensional array of 'markers', detectable by the amplitude variations in the back-scattered electron current and of known, previously measured relative position. The observed position of each marker in the array is measured and compared to the expected position from the prior measurement. From the differences, correcting values are calculated and applied.

Figure 5:
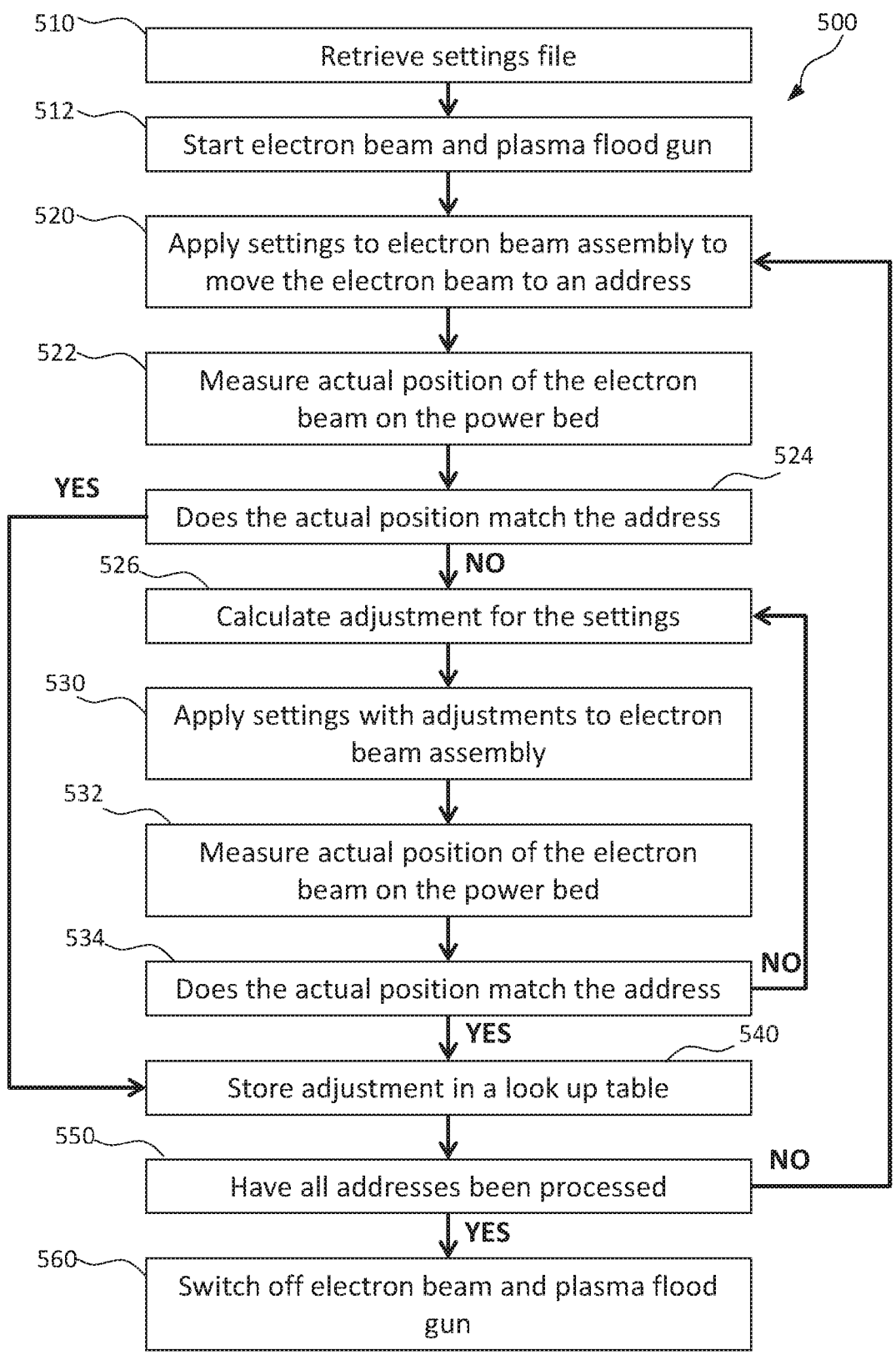
FIG. 5 shows a method of calibrating an additive manufacture apparatus to compensate for deflections of the ion beam caused by the plasma source.

Such a calibration method 500 is shown in FIG. 5. The method 500 starts at step 510 where the controller 110 of FIG. 1 retrieves a settings file. This settings file provides the settings required for the electron optical assembly 101 to position the electron beam 103 at a desired position on the powder bed 123. The settings assume there is no plasma source 160 or that the plasma source 160 is not operating. For example, the settings may be obtained by running the apparatus 100 without the plasma source 160 switched on, and recording the settings used to obtain each electron beam 103 position. The settings file may be a look-up table indexed by electron beam 103 addresses on the powder bed 123 and providing the settings found to position the electron beam 103 at that address.

At step 512, the controller 110 directs the electron optical assembly 101 to start the electron beam 103. At beam start up, the electron beam 103 is steered to be clear of the powder bed 123.

At step 520, the controller 110 takes an address from the settings file and applies the corresponding settings to the electron optical assembly 101 thereby setting a position of the electron beam 103. Next, the actual position of the electron beam 103 on the powder bed 123 is measured. This may be done by any conventional technique, for example by capturing images of the electron beam 103 on calibrated marker plates and using image analysis techniques to determine the beam position. At step 524, a test is performed by the controller 110 to determine whether the measured actual position matches the location of the address, i.e. whether the electron beam 103 was successfully set to the desired address on the powder bed 123 or whether the electron beam 103 has been deflected away from the desired position. If the actual position matches the desired address position, the method may proceed directly to step 540 where a zero adjustment factor is stored in an adjustments file to indicate that no adjustment need be made to the settings used for this address. However, if the actual position is found not to match the desired address position, the method 500 proceeds to step 526. At step 526, the controller 110 calculates an adjustment for the settings that should see the electron beam 103 returned to the desired address position on the powder bed 123. This may be done, for example, by applying a linear correction factor that multiplies the difference between the desired position and the actual position by a scaling factor. The scaling factor may be determined empirically. In any event, the correction does not need to be exact, as a test is performed and the method may loop back to this corrections step thereby allowing the correction factor to be improved iteratively. How the adjustment is tested will now be described.

To test whether the adjustment is successful in ensuring the electron beam 103 is set to the desired address position, step 530 sees the controller 110 apply the adjustments to the settings, and then apply the adjusted settings to the electron optical assembly 101 thereby setting a position of the electron beam 103. Then, at step 532, the actual position of the electron beam 103 on the powder bed 123 is measured once more, for example using the calibrated marker plates, and, at step 534, the test to determine whether the measured actual position matches the location of the address is repeated by the controller 110. If the actual position does not match the desired address position, the method 500 returns via loop 535 to step 526 where the adjustment is re-calculated, re-applied and re-tested again and again until the residual error is below an acceptable value. In this way, the required adjustment may be found iteratively. Once the controller 110 determines that the actual position matches the desired address position on the powder bed 123, the method 500 may proceed to step 540 where the adjustment is stored in an adjustments file.

This adjustments file is a look-up table relating addresses on the powder bed 123 to an adjustment factor to be applied to the settings stored in the settings file for the same address. These adjustment factors are stored in memory in a 2D array, indexed by the desired electron beam 103 position. From these adjustment factors, a 2D curve fit may be applied to determine coefficients of a polynomial equation that describes a relationship describing the adjustment factors. For example, polynomials of the form $X'=a_0+a_1 \cdot X+a_2 \cdot X^2+a_3 \cdot X \cdot Y+a_4 \cdot Y+a_5 \cdot Y^2+\ldots$, may be used where $a_0$, $a_1$, etc. are the coefficients of the polynomial and the order of the polynomial may or may not be limited to the second order shown. There are many types of fitting that may be used including, but not limited to, cubic splines and Lagrange polynomials. This polynomial can be used to produce a finer grained look-up table or, alternatively, the coefficients may be applied directly to the desired deflection values set on the electron optical assembly 101 to produce the desired electron beam 103 position. Thus, the adjustment factors may be stored in a look-up table or the coefficients may be stored. As will be appreciated, rather than storing adjustment factors that are to be applied to the electron optical assembly 101 settings, corrected settings may be stored that are applied directly to the electron optical assembly 101.

When the plasma source 160 is in operation, the adjustments file may be used to apply adjustments to the settings used for the electron optical assembly 101 to compensate for the electron beam deflection caused by the plasma source 160.

Returning to the method 500 of FIG. 5, once the adjustment has been stored at step 540, the method 500 proceeds to step 550 where the controller 110 checks to see whether all addresses have been calibrated. If all addresses have been calibrated, the method proceeds to step 560 where the electron beam 103 and plasma source 160 are switched off. If further addresses require calibration, the method 500 continues back along loop 555 to return to step 520 where the settings for the next address are retrieved by the controller 110 and applied to the electron optical assembly 101. The method then continues through steps 522, 524, 526, 530, 532, 534, 540 and 550 as described above to complete the calibration for that address.

The measurement process of FIG. 5 may be repeated for a range of plasma source 160 operating conditions, including not operational, to build up a set of look-up tables containing the adjustment factors (which may be polynomials of the type described above).

Figure 6:
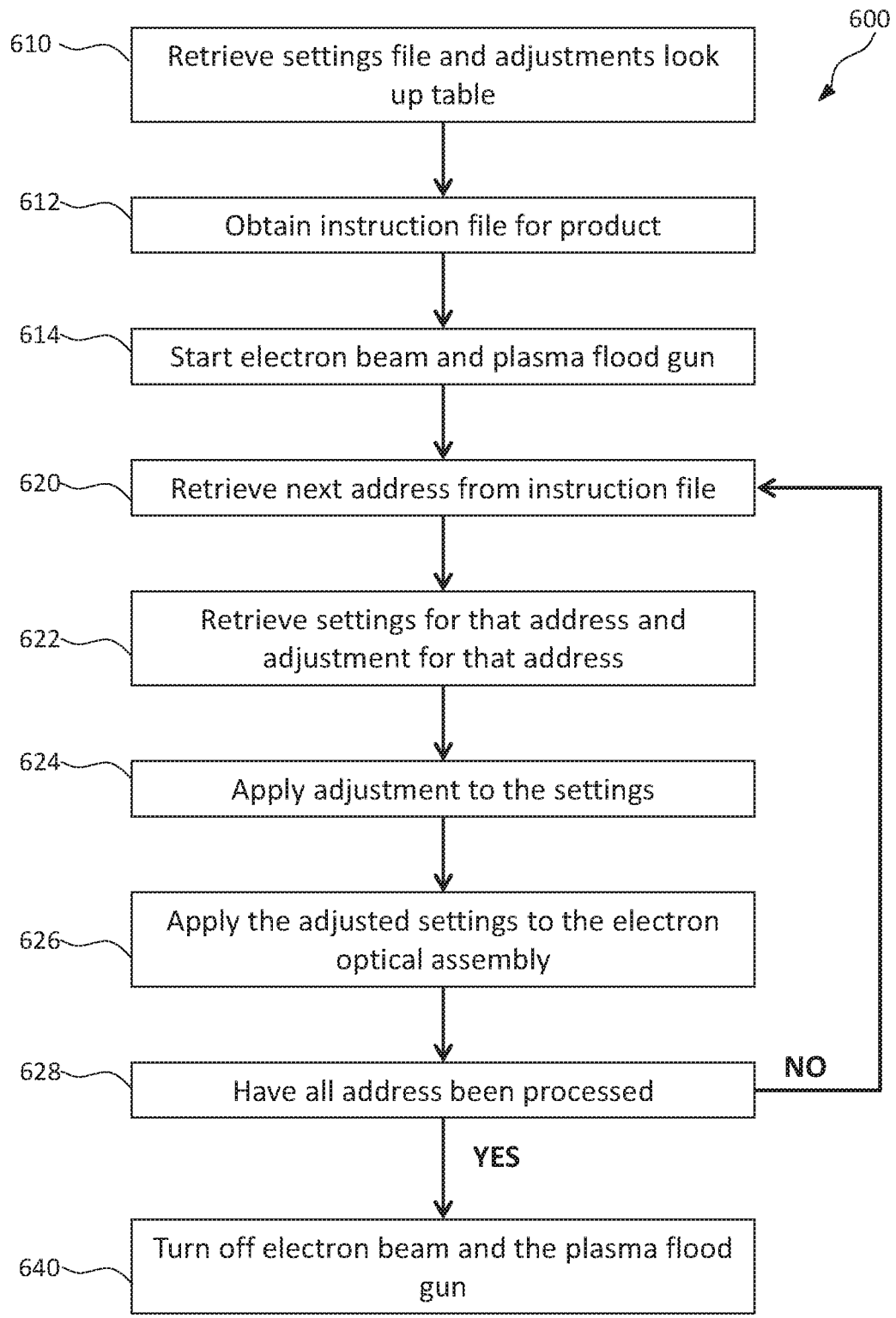
FIG. 6 shows a method of operating an additive manufacture apparatus that includes compensating for deflections of the electron beam caused by the plasma source.

FIG. 6 shows a method 600 of operating an additive manufacture apparatus that includes compensating for deflections of the electron beam 103 caused by the plasma source 160, for example by using adjustments found in accordance with the method 500 of FIG. 5.

At step 610, the controller 110 retrieves the appropriate settings file and the appropriate adjustments file that contains the look up table providing the adjustments required for each address on the powder bed 123. The adjustment file retrieved corresponds to those stored for the selected operation settings of the plasma source 160. Where corrected settings are stored in the adjustments file that are applied directly to the electron optical assembly 101, only the adjustments filed need be retrieved.

The controller 110 also obtains an instruction file for a product 150 to be made at step 612. The instruction file contains the instructions to be followed by the controller 110 to form the product 150, for example the sequence of addresses to send the electron beam 103 to form each layer of the product 150. The order of steps may 610 and 612 may be reversed, or both steps may be performed concurrently.

At step 614, the controller 110 starts the electron beam 103 and the plasma source 160. Once the electron optical assembly 101 and the plasma source 160 have settled to steady operation, the controller 110 may start to form the product, as follows.

At step 620, the controller 110 retrieves the next address from the instruction file. For the first pass through this step, the address will be the first address for the first layer of the product 150. Then, at step 622, the controller 110 retrieves the settings for that address from the settings file and also retrieves the adjustment factors for that address from the adjustments file. This will yield up the adjustment factors to be applied to the settings of the electron optical assembly 101. Where the desired address does not have an entry in the indices of the look-up table, either the nearest address may be used or the values for a nearby address may be further refined by interpolation.

Next, at step 624, either the adjustment factors may be applied to the settings for the electron optical assembly 101 where adjustments are stored, or this step may be omitted where corrected values are stored in the adjustments file. Alternatively, where coefficients are stored in the adjustments file, the polynomial coefficients may be used to calculate the settings of the electron optical assembly 101 to provide the desired electron beam 103 position at step 624. This calculation may be applied in software (either earlier or, as described here, when the value is about to be used), or may be applied in hardware by using a network of multipliers and adders to generate the terms of the polynomial, to apply the coefficients to the settings of the electron optical assembly, and to sum the whole together. This hardware implementation may use analogue circuits, dedicated digital circuits or programmable logic.

Next, the controller 110 can apply the adjusted settings to the electron optical assembly 101 at step 626. This will cause the electron beam to move to the address specified by the instructions file.

The controller 110 then determines whether all addresses have been processed at step 628. If all addresses have been processed, then the method 600 proceeds to step 640 where the controller 110 turns off the electron beam 103 and the plasma source 160. However, if not all addresses have been processed, the method 600 returns along loop 629 to step 620 where the next address is retrieved from the instruction file. The method may then proceed through steps 622, 624, 626 and 628 to see the electron beam 103 scanned to the next address. If the next address is flagged as belonging to the next layer to be formed, further steps may be performed between steps 620 and 626 where the table 130 is dropped and new powder 122 spread to form the powder bed 123 for the next layer of the product 150.

In this way, the electron beam 103 may be scanned though all the addresses specified in the instruction file, for each of the layers of the product 150 such that the product 150 is formed by additive layer manufacture. By using the plasma source 160 and by applying the adjustments, the position of the electron beam 103 may be accurately controlled such that the quality of the product 150 formed is superior.

Those skilled in the art will appreciate that variations may be made to the above embodiments without departing from the scope of the invention that is defined by the appended claims.

For example, a plasma source 160 that uses an arc chamber 310 is described above. Other types of electron impact may be used to create a plasma. Also, RF (radio frequency) or ECR (electron cyclotron resonance) ion source or plasma source, capable of supplying sufficient fluxes of ions may also be used, and in such embodiments, the configuration is a device that is bolted on to the chamber 140 and is equipped with an ion drift tube to guide the ion flux to the space charge cloud 410.

The apparatus 100 is configured to generate an electron beam 103 and scan the electron beam 103 over the powder bed 123 to fuse the metal powder 122. As noted above, a beam of positively charged ions may be used in place of the electron beam 103. In this case, the positive ions used to neutralise the negative charge build up in and above the powder bed 123 may be replaced with electrons. Hence, a suitable electron source may be used such as a plasma source 160, with an appropriate bias polarity. Also, a suitable positive ion source may be used to replace the electron source 102 in the electron optical assembly 101, and in such embodiments the electron optical assembly is referred to as a charged particle optical assembly or system. The charged particle optical assembly 101 may still contain lenses 220 for forming and conditioning the positive ion beam, and one or more electromagnetic deflectors 240 for steering the positive ion beam, albeit with allowances made for the fact that the beam is positively charged rather than negatively charged and that the charged particles have greater mass. The cylinder electrode 250 may also be retained, although will now be biased with a negative potential to repel the neutralising electrons.

Although the plasma source 160 is described in the embodiments above as being positioned within the vacuum chamber, it is possible, in embodiments of the present invention, for the plasma source 160 to be positioned in a sub-chamber within the main vacuum chamber comprising the powder bed 123. The plasma source 160 is connected to the main vacuum chamber via the plasma aperture through which ions are allowed to exit into the main chamber.

In alternative embodiments of the invention, the plasma source 160 is positioned outside the vacuum chamber, and connected to it via drift tube. Such a configuration would be suitable, for instance, when the plasma source would be an ECR or RF excited plasma source.

This drift space between the main vacuum chamber and the plasma source 160 (itself at a vacuum pressure similar to the main chamber pressure) is, in some embodiments, an electrically conducting tube that is electrically isolated from the body of the plasma source and also the main vacuum chamber. This will allow the drift tube to be biased at a potential optimum for the passage of ions into the main vacuum chamber.

In some embodiments, the drift tube can be adapted to be a focusing drift tube, comprising a number (for example, two or three) of electrostatically independently biased elements, or alternatively, a single electrostatically biased elements. This may permit more efficient transport of the ions to the powder bed 123.

In the case of having the plasma source 160 outside the main vacuum vessel at least two further improvements can be obtained. Firstly the d.c. current needed to heat up the flood gun filament is significant and has associated with it a dc magnetic field. If the magnetic field is sufficiently large to interfere with the electron beam, it can force a calibration procedure of the electron beam. By putting the plasma source 160 outside of the main vacuum chamber it can be removed further away from the electron beam and hence the influence it exerts on the beam is less.

If the plasma source 160 has a heated tungsten filament, it will slowly burn away and will eventually break at the end of its lifetime. Additionally, tungsten atoms continually boil off the surface of the filament. By putting the plasma source 160 outside the main vacuum chamber, contaminants from the filament both during operation, and when it breaks, will be prevented from mixing with the powder bed 123. Conversely having the plasma source within the vacuum chamber is likely to increase the discharge current onto the powder bed 123 giving a higher charge neutralisation yield.

Whether the plasma source 160 is inside or outside the main vacuum chamber, its associated supplies (inert gas, cooling water circuit, electrical connections) are isolated from the main body of the vacuum chamber, which is considered to be at an electrically ground potential.

In some embodiments, within the main vacuum chamber may be electrically isolated metallic sheets that act as a heat shield, reflecting the radiated heat of the powder bed 123 back to the powder bed 123. A positive bias potential can be applied to these heat shields in order to increase the ion current to the powder bed 123.

Similarly a focusing means, such as cone, or a series of focusing electrostatic elements (for example, a double or triple cylinder electrostatic lens system), each biased to independent potentials, can be placed at the output of the drift tube (for the case when the plasma source 160 is external to the main chamber) or at the exit aperture of the flood gun for the case where the plasma flood source is within the main chamber. The focusing component encourages the ions to flow out and towards the powder bed 123. The magnitude of the bias potentials will depend on the magnitude of the bias potential supplied to the main body of the plasma source 160 by its own bias supply.

The invention claimed is:

1. A method of charge mitigation in additive layer manufacturing using a charged particle beam to fuse metal powder within a metal powder bed to form a product layer-by-layer, the method comprising:
   using a charged particle beam optical system to form a charged particle beam, to steer the charged particle beam to be incident on a powder bed of metal powder and to scan over the powder bed to fuse powder into a desired layer shape;
   while steering the charged particle beam, using a neutralising particle source to generate neutralising particles of an opposite charge to the charged particles in the vicinity of the charged particle beam such that the neutralising particles are attracted to the charged particles of powder in the powder bed; and comprising steering the charged particle beam using a control signal to which has been applied a correction to compensate for the disturbance of the charged particle beam caused by the neutralising particle source.

2. The method of claim 1, wherein the charged particle beam is an electron beam and the neutralising particles are positively charged ions.

3. The method of claim 2, wherein the neutralising particle source is an ion source and the method comprises using the ion source to generate positive ions of an inert gas.

4. The method of claim 3, wherein the inert gas is helium.

5. The method of claim 2, comprising using a plasma source as the neutralising particle source, to generate the positive ions.

6. The method of claim 1, wherein the charged particle beam is a positively charged ion beam, and the neutralising particles are electrons.

7. The method of claim 6, wherein the neutralising particle source is an electron source and the method comprises using the electron source to generate electrons.

8. The method of claim 1, comprising using an electrode to set an electric potential upstream of the neutralising particle source that is of the same polarity as the neutralising particles thereby preventing neutralising particles from migrating past the electrode to the charged particle beam optical system.

9. The method of claim 1, wherein the correction is obtained from a look-up table that provides the required corrections for a given desired charged particle beam position on the powder bed.

10. The method of claim 9, further comprising an initial step of scanning the charged particle beam through a series of expected charged particle beam positions on the powder bed while the neutralising particle source is operating, measuring the corresponding actual positions of the charged particle beam on the powder bed for each of the expected charged particle beam positions, calculating a correction to compensate for the difference between each pair of corresponding expected and actual charged particle beam positions, and storing the corrections in a look-up table.

11. An additive layer manufacturing apparatus comprising:
a charged particle optical assembly comprising a charged particle source, charged particle beam forming apparatus operable to form a beam from the charged particles provided by the charged particle source, and charged particle beam steering apparatus operable to steer the charged particle beam formed by the charged particle beam forming apparatus;
at least one hopper operable to dispense powder;
a table positioned to receive the powder dispensed by the at least one hopper in a volume defining a powder bed for receiving the charged particle beam wherein the charged particle beam steering apparatus is operable to scan the charged particle beam over the powder bed;
a chamber through which the charged particle beam passes before being incident on the powder bed;
a neutralising particle source operable to provide neutralising particles of an opposite charge to the charged particles in the chamber in the vicinity of the charged particle beam such that the neutralising particles are attracted to the charged particle beam and the charged powder particles caused by the charged particle beam; and a controller operable to control operation of the charged particle optical assembly, wherein the controller is operable to provide a control signal to the charged particle beam steering apparatus that causes the charged particle beam steering apparatus to scan the charged particle beam over the powder bed to fuse powder into a desired layer shape,
wherein the controller is operable to apply a correction to the control signal to compensate for the disturbance of the charged particle beam caused by the neutralising particle source.

12. The additive layer manufacturing apparatus of claim 11, wherein the charged particle beam is an electron beam, and the neutralising particles are positively charged ions.

13. The additive layer manufacturing apparatus of claim 12, wherein heat shields and electrode plates within the chamber are electrically isolated and have a bias potential applied to them in order to focus and constrain the neutralising particles.

14. The additive layer manufacturing apparatus of claim 13, wherein the neutralising particle source is arranged outside the chamber and coupled to the chamber by a drift tube.

15. The additive layer manufacturing apparatus of claim 14, wherein the drift tube comprises a focusing means.

16. The additive layer manufacturing apparatus of claim 12, wherein the neutralising particle source is a plasma source.

17. The additive layer manufacturing apparatus of claim 12, wherein the positive ions are ions of helium.

18. The additive layer manufacturing apparatus of claim 12, wherein the neutralising particle source is a DC plasma source operable to generate DC magnetic fields to contain the positive ions.

19. The additive layer manufacturing apparatus of claim 12, wherein the neutralising particle source is an ECR or RF ion source.

20. The additive layer manufacturing apparatus of claim 11, wherein the charged particle beam is a positively charged ion beam and the neutralising particles are electrons.

21. The additive layer manufacturing apparatus of claim 11, further comprising an electrode positioned on the path along which the charged particle beam travels between the charged particle optical assembly and the neutralising particle source, arranged to repel neutralising particles from migrating to the charged particle assembly.

22. The additive layer manufacturing apparatus of claim 21 wherein the electrode is configured to be biased with the same charge as the neutralising particles.

23. The additive layer manufacturing apparatus of claim 22, wherein the electrode comprises a metal plate with an aperture provided therethrough, positioned such that the charged particle beam steering apparatus is operable to steer the charged particle beam to pass through the aperture.

24. The additive layer manufacturing apparatus of claim 11, wherein the controller retrieves the correction from a look-up table that provides the required corrections for a given desired charged particle beam position on the powder bed.

25. The additive layer manufacturing apparatus of claim 24, wherein the corrections stored in the look-up table were obtained by scanning the charged particle beam through a series of expected charged particle beam positions on the powder bed while the neutralising particle source is operating, measuring the corresponding actual positions of the charged particle beam on the powder bed for each of the expected charged particle beam positions, and calculating a correction to compensate for the difference between each pair of corresponding expected and actual charged particle beam positions.

* * * * *